United States Patent [19]

Yee

[11] Patent Number: 4,710,653

[45] Date of Patent: Dec. 1, 1987

[54] EDGE DETECTOR CIRCUIT AND OSCILLATOR USING SAME

[75] Inventor: Seening Yee, Port Washington, N.Y.

[73] Assignee: Grumman Aerospace Corporation, Bethpage, N.Y.

[21] Appl. No.: 882,146

[22] Filed: Jul. 3, 1986

[51] Int. Cl.[4] .............. G01R 19/145; H03K 5/13; H03K 5/159; H03K 5/22

[52] U.S. Cl. .................................. 307/518; 307/601; 307/602; 307/603; 328/55; 328/111

[58] Field of Search ............. 328/55, 58, 63, 112, 328/111; 307/517, 518, 268, 269, 273, 597, 234, 265, 601, 602, 603, 605; 365/233; 331/57; 333/139, 152

[56] References Cited

U.S. PATENT DOCUMENTS

| | | | |
|---|---|---|---|
| 2,436,808 | 3/1948 | Jacobsen et al. | 331/145 |
| 3,073,971 | 1/1963 | Daigle | 307/601 |
| 3,073,972 | 1/1963 | Jenkins | 307/601 |
| 3,202,769 | 8/1965 | Coleman, Jr. | 333/139 |
| 3,244,907 | 4/1966 | Daigle, Jr. | 307/601 |
| 3,262,069 | 7/1966 | Stella | 331/57 |
| 3,328,724 | 6/1967 | Way | 331/113 |
| 3,350,659 | 10/1967 | Henn | 331/57 |
| 3,351,871 | 11/1967 | Swain | 331/57 |
| 3,411,107 | 11/1968 | Rees | 307/601 |
| 3,508,083 | 4/1970 | Stern | 307/601 |
| 3,543,184 | 11/1970 | Lane | 331/111 |
| 3,551,705 | 12/1970 | Juliusburger | 307/601 |
| 3,558,933 | 1/1971 | Meyer | 307/603 |
| 3,562,559 | 2/1971 | Rapp | 331/113 |
| 3,671,881 | 6/1972 | Yorganjian | 331/113 |
| 3,708,757 | 1/1973 | Savarese et al. | 331/57 |
| 3,735,270 | 5/1973 | Holub | 307/601 |
| 3,745,380 | 7/1973 | Kitajima et al. | 331/113 |
| 3,778,727 | 12/1973 | Williams | 307/234 |
| 3,875,527 | 4/1975 | Garcia | 331/113 |
| 3,906,409 | 9/1975 | Whitehouse | 333/139 |
| 3,909,635 | 9/1975 | Maida | 331/113 |
| 4,001,716 | 1/1977 | Swanson et al. | 331/145 |
| 4,069,429 | 1/1978 | White et al. | 307/265 |
| 4,091,335 | 5/1978 | Giolma et al. | 331/1 A |
| 4,157,480 | 6/1979 | Edwards | 307/465 |
| 4,236,121 | 11/1980 | Senturia | 331/57 |
| 4,347,617 | 8/1982 | Murano et al. | 307/234 |
| 4,401,956 | 8/1983 | Joshi | 333/152 |
| 4,471,235 | 9/1984 | Sakhuja et al. | 307/234 |
| 4,494,021 | 1/1985 | Bell et al. | 307/601 |
| 4,521,694 | 6/1985 | Ryczek et al. | 307/266 |
| 4,583,008 | 4/1986 | Grugett | 328/55 |
| 4,617,529 | 10/1986 | Suzuki | 331/57 |

FOREIGN PATENT DOCUMENTS

| | | | |
|---|---|---|---|
| 54-97413 | 8/1979 | Japan | 307/471 |
| 0179979 | 11/1982 | Japan | 365/233 |

OTHER PUBLICATIONS

Maley, G. A., "Ring Oscillator with Improved Reliability", IBM Technical Disclosure Bulletin, vol. 26, No. 8, Jan. 1984, pp. 4061-4062.

Dellamano, Harry A., "XOR-gated Oscillator Operates Reliably, Easily", Electronic Design, vol. 28, No. 19, Sep. 13, 1980, p. 146.

Primary Examiner—Stanley D. Miller
Assistant Examiner—Trong Quang Phan
Attorney, Agent, or Firm—Richard G. Geib; Daniel J. Tick; David Aker

[57] ABSTRACT

A circuit useful as an edge detector or pulse width encoder which receives an input signal and supplies a logic output signal includes a delay and inverting circuit for logically inverting and delaying input signals so as to supply a delayed and inverted signal or pulse. The circuit also includes a gate having a first input for receiving the input signal and a second input for receiving the delayed and inverted pulse. The gate provides a logic output signal whenever the input pulse signal and the delayed and inverted output pulse are at different logic levels. The circuit may be expanded with additional circuit elements including a delay circuit for delaying the input signal and an additional gate having an input for receiving the logic output signal and an output connected to the input of the delay circuit. The expanded circuit oscillates at a frequency which varies in response to the delays in the circuit. A control gate also may be included so that the logic level of a control signal determines whether the circuit oscillates.

27 Claims, 7 Drawing Figures

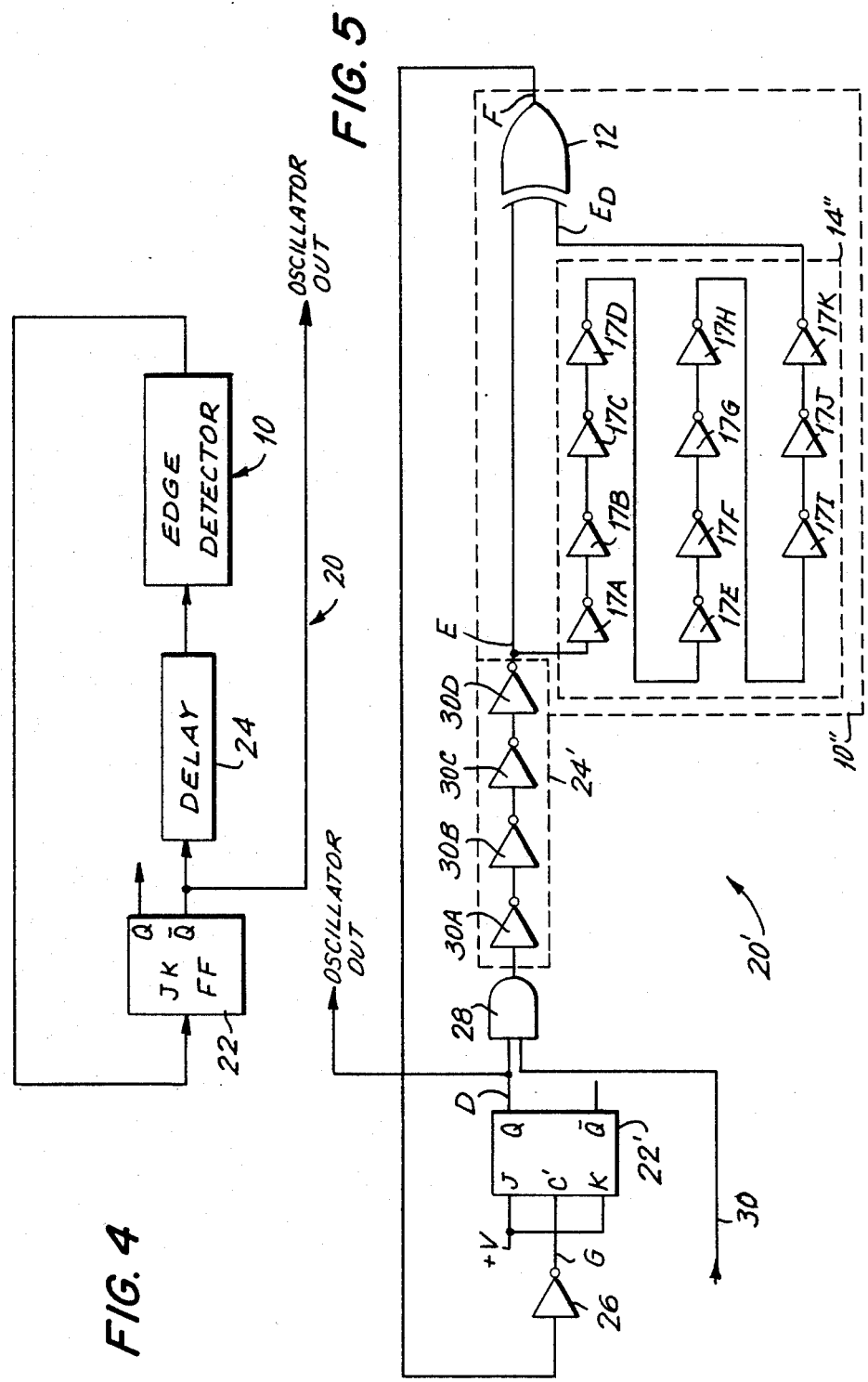

EDGE DETECTOR CIRCUIT AND OSCILLATOR USING SAME

BACKGROUND OF THE INVENTION

The present invention relates to circuits useful in electronic measuring instruments. More particularly, it relates to circuits used to detect the edges of pulses, and the application of such circuits to an oscillator useful in measuring instruments and in frequency encoding of digital signals or data for transmission purposes.

There are many types of pulse shaping circuits which are used to detect the leading edge, or trailing edge of a pulse. Many of these circuits produce output signals which undergo a transition in logic level at times other than the occurrence of transitions in the applied input pulse. For example, generally the leading edge or trailing edge of the output pulse will be delayed by a fixed time interval with respect to that of the input pulse. While useful in many applications, fixed delays do not facilitate the encoding of information on to the output waveform.

The principal object of the present invention is to provide an edge detector circuit wherein the width of the output pulses can be readily controlled.

An object of the invention to is provide an edge detector circuit wherein the output waveform is readily varied in accordance with a variable propagation delay.

Another object of the invention is to provide a circuit which performs a frequency doubling function.

Still another object of the invention is to provide a circuit which is useful for detecting sudden changes in a signal produced by a transducer Yet another object of the invention is to provide a circuit useful for making delay measurements Another object of the invention is to provide a circuit useful for performing pulse width modulation Still another object of the invention is to provide an oscillator wherein frequency of oscillation varies in a known manner in accordance with circuit delays Yet another object of the invention is to provide an oscillator wherein the values of at least two variables may be encoded into the output waveform.

Another object of the invention is to provide an oscillator having an output which is turned on or off in response to a logic control signal.

Still another object of the invention is to provide an oscillator which may be made up entirely of integrated circuit logic components.

BRIEF SUMMARY OF THE INVENTION

In accordance with the invention, a first circuit receives an input signal and supplies a logic output signal which indicates the presence of positive or negative edge transitions of the input signal. The circuit includes a delay and inverting means for logically inverting and delaying an input pulse signal so as to supply a delayed and inverted signal or pulse. The circuit further includes a two input gate means having a first input for receiving the input pulse directly and a second input for receiving the delayed and inverted pulse. The gate means provides a logic "0" outut signal whenever the input pulse signal and the delayed and inverted pulse are at the same "0" or "1" logic levels and a logic "1" output signal whenever the input pulse signal and the delayed and inverted pulse are at different logic levels.

Preferably, the delay and inverting means is configured to delay the input pulse for a period of time shorter than the width of the input pulse. Further, the delay and inverting means may provide a variable delay in accordance with a value of an electrical parameter so as to vary the duration of the logic output signal. The delay and inverting means may include a transducer for changing the electrical parameter or the delay introduced in accordance with a physical variable.

The delay and inverting means may include at least one delay means for delaying the input pulse and a logic inverter for inverting the input pulse. The delay means and the logic inverter may be separate components of the circuit.

The first circuit may be incorporated into a second circuit which also includes a delay means for delaying the input pulse supplied to the first circuit and an additional gate means having an input for receiving the logic output signal of the first circuit and an output connected to the input of the additional delay means. The additional gate means is configured so that a logic state of the pulse provided at the output thereof changes upon selected changes in state of the logic output signal.

The circuit may also include a control gate having a first input for receiving the pulse generated by the additional gate means, a second input for receiving a control signal and an output connected to the input of the delay means. The control gate is configured so that a logic state of the control signal controls whether the output of the additional gate means is supplied to the delay means.

BRIEF DESCRIPTION OF THE DRAWINGS

In order that the invention may be readily carried into effect, it will now be described with reference to the accompanying drawings, wherein:

FIG. 4 is a block diagram of an oscillator circuit in accordance with the invention which utilizes the edge detector circuit of FIG. 1 or FIG. 2;

FIG. 5 is a detailed schematic diagram of an oscillator circuit similar to that of FIG. 4, including a control gate;

DETAILED DESCRIPTION OF THE PREFERRED EMBODIMENTS

Although the invention relates to an edge detector circuit, it also encompasses an oscillator circuit using the edge detector circuit.

Figure 1:
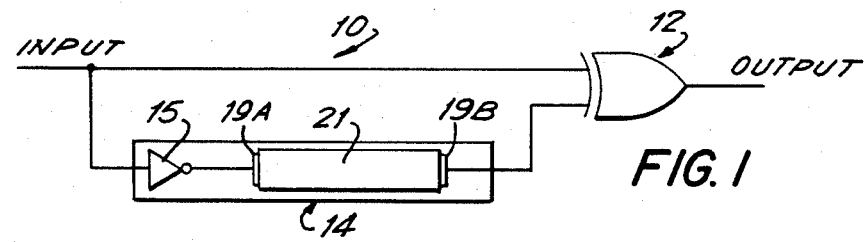
FIG. 1 is a simplified schematic diagram of an edge detector circuit in accordance with the invention.
Figure 3:
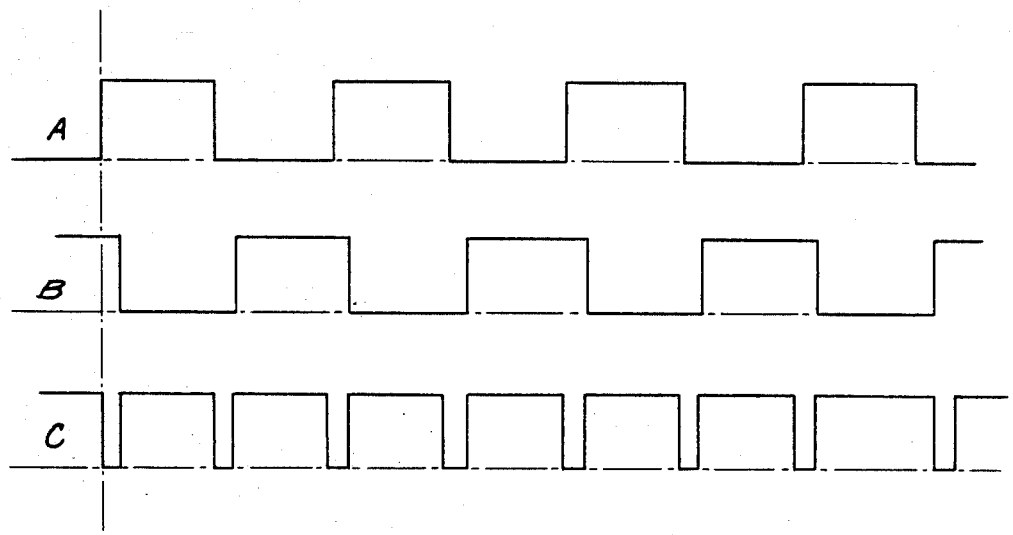
FIG. 3 illustrates a set of timing diagrams for the circuit of FIG. 2.

Referring to FIG. 1, an input signal which may be a series of pulses having an input waveform A (FIG. 3) is supplied as an input to an edge detector circuit shown generally as 10. The input signal is applied directly to a first input of an EXCLUSIVE OR gate 12. The input signal is also applied to the input of a delay/inverter circuit 14 to produce a delayed and inverted signal or pulse having a waveform B (FIG. 3), when waveform A is applied at the input of delay/inverter circuit 14. The output of delay/inverter circuit 14 is applied to the second input of EXCLUSIVE OR gate 12. As is well known, EXCLUSIVE OR gate 12 produces a high level or logic "1" output whenever the two inputs thereof are at different logic levels, and a low logic level or logic "0" output whenever the two inputs thereof are at the same logic level. When input waveform A is supplied to circuit 10, output waveform C (FIG. 3) is produced. It will be noted that edge detector circuit 10 serves as a frequency doubler; that is the frequency of output waveform C is twice that of input waveform A. It will also be noted by comparing waveform A and waveform B that the delay produced by delay/inverter circuit 14 is much smaller than the length of a single pulse of waveform A. While this relatively short delay is preferable, longer periods of delay are not excluded.

The order of the delay and inverting functions in delay/inverter circuit 14 is not of importance. A single delay means, such as a logic driver, may be used to produce the required delay. A separate circuit element such as an inverter may be used to logically invert the input signal.

It will be recognized that the length of time during which waveform C remains at a low logic level is equal to the time delay between waveform A and waveform B. Thus, if the delay element of delay/inverter circuit 14 provides a delay related to some electrical parameter such a current, voltage, frequency, etc. in some definite way, then circuit 10 may be used as a pulse width encoder for the value of that parameter. For example, if a capacitor is charged to a first voltage through a resistor by a fixed voltage source, a time interval for charging may be defined. If the capacitor is first charged by a variable voltage source to a second voltage, the time required for the voltage across the capacitor to change from the second voltage to the first voltage may provide a delay which is related to the voltage level of the variable voltage source. Thus, the voltage of the variable voltage source will be represented by a pulse width output of gate 12. A transducer may relate the voltage of the variable voltage source to the value of a physical parameter.

The value of the parameter being encoded will generally be related to some physical condition such as temperature, pressure, humidity, etc. For example, the delay element may be an electrical or ultrasonic delay line wherein the delay varies as a function of temperature in a known manner. Circuit 10 will act as a pulse width encoder, with the length of time that the output of EXCLUSIVE OR gate 12 remains in a low condition being related to temperature.

It is also possible for circuit 10 to be used in evaluating the characteristics of a material under test, if, for example, those characteristics are related to a physical property such as the velocity of sound in the material. The time delay produced will be inversely proportional to the velocity of sound in the material. In this case, delay inverter circuit 14 may include a logic inverter 15, a pair of ultrasonic transducers 19A and 19B and a material under test 21. Various amplifier and pulse shaping circuits (not shown) may be used in association with transducers 19A and 19B, as is well known in the art.

It will be recognized by one skilled in the art that any one of a great variety of parameters or physical variables can be pulse width encoded by circuit 10. Further, if it is desired that the length of time that the output of circuit 10 is at a high logic level be proportion to the delay provided by delay/inverter circuit 10, the output of circuit 10 need only be logically inverted.

Figure 2:
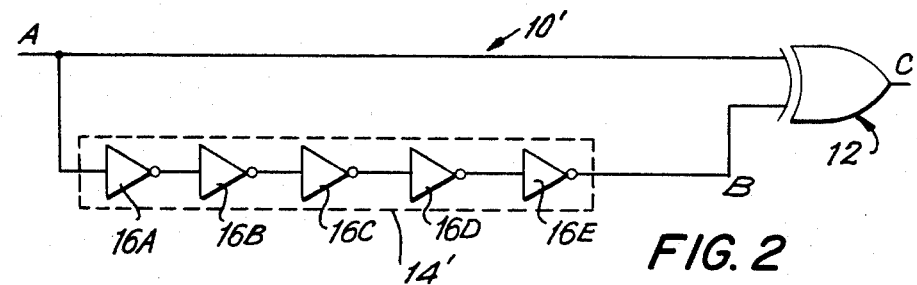
FIG. 2 is a more detailed schematic of an edge detector circuit similar to that of FIG. 1.

Referring to FIG. 2, an edge detector circuit 10', includes an EXCLUSIVE OR gate 12 identical to gate 12 of circuit 10 of FIG. 1. Circuit 10' includes a delay/inverter circuit 14' made up of a series of five logic inverters 16A, 16B, 16C, 16D and 16E. The input of inverter 16A receives the input pulse signals (waveform A). The output of inverter 16A is connected to the input of the next successive inverter 16B. The output of each inverter is connected to the input of the next successive inverter. However, the output of inverter 16E is connected to the second input of EXCLUSIVE OR gate 12.

It will be recognized that each inverter 16A to 16E provides a portion of the total delay provided by delay/inverter circuit 14'. If each inverter is one of several inverters packaged together in one integrated circuit package, the amount of delay produced by each inverter will be substantially identical. If the delay varies with temperature, then it will change by substantially the same amount in each inverter 16A to 16E.

In order for delay/inverter circuit 14' to perform the function of logically inverting waveform A to produce waveform B, it is required that circuit 14' have an odd number of inverters connected so that the output of each inverter is supplied to the input of the next successive inverter and that the output of the last inverter be applied to an input of EXCLUSIVE OR gate 12.

FIG. 4 illustrates an oscillator circuit 20 using an edge detector circuit 10 according to the present invention. The output of edge detector circuit 10 is provided to the clock input of a negative edge triggered J-K flip flop 22. An appropriate output of flip flop 22, the $\overline{Q}$ output, is connected to the input of a delay circuit 24. While the $\overline{Q}$ output of flip flop 22 may be used as an oscillator output, the Q output is also available.

Oscillator 20 is made up of only integrated circuit elements. No resistors, capacitors, inductors or crystal elements are required. The J-K flip flop 22 is connected so that when power is turned on, either a rising or a falling edge is generated at its output. Delay circuit 24 will delay this rising or falling edge. The delayed signal output of delay circuit 24 is supplied as an input to edge detector circuit 10 which generates pulses at its output in response to each input pulse. The output of edge detector circuit 10 is fed back as a clock input to flip flop 22, sustaining oscillation.

FIG. 5 is a detailed schematic diagram of an oscillator circuit 20' in accordance with the present invention. Circuit 20 includes an edge detector circuit 10" having an EXCLUSIVE OR gate 12 and a delay/inverter circuit 14" having eleven delay elements in the form of inverters 17A to 17K. The output of EXCLUSIVE OR gate 12 is connected to the input of an inverter 26. The output of inverter 26 is in turn connected to the clock input C' of J-K flip flop 22'. The J and K inputs of flip flop 22' are connected to the positive supply voltage. Under these conditions, the states of the Q and $\overline{Q}$ outputs of flip flop 22' toggle or change every time the falling or trailing edge of a clock pulse is provided at the clock input C' of flip flop 22'.

The Q output of flip flop 22' is connected to a first input of an AND gate 28. The Q output of flip flop 22' provides an output of oscillator circuit 20'. A second input of AND gate 28 is connected to a control input line 30 to which a control signal is applied to control whether oscillator circuit 20' is operational or is turned off. When a logic zero is applied to control line 30, the output of AND gate 28 remains at a low logic level, regardless of the state of the Q output of flip flop 22' and oscillation in circuit 20' will not occur. When a high logic level, or logic one is applied to control line 30, the logic level of the Q output of flip flop 22' is supplied as a controlled input signal to the input of delay circuit 24'.

Delay circuit 24' includes four inverter circuits 30A, 30B, 30C and 30D. Delay circuit 24' is similar to delay-/inverter circuit 14' of FIG. 2, but uses an even number of inverters so that the signal produced at the output of inverter 30D is of the same logic state as that at the input of inverter 30A, but delayed by the propagation delay of inverters 30A to 30D.

Figure 6A:
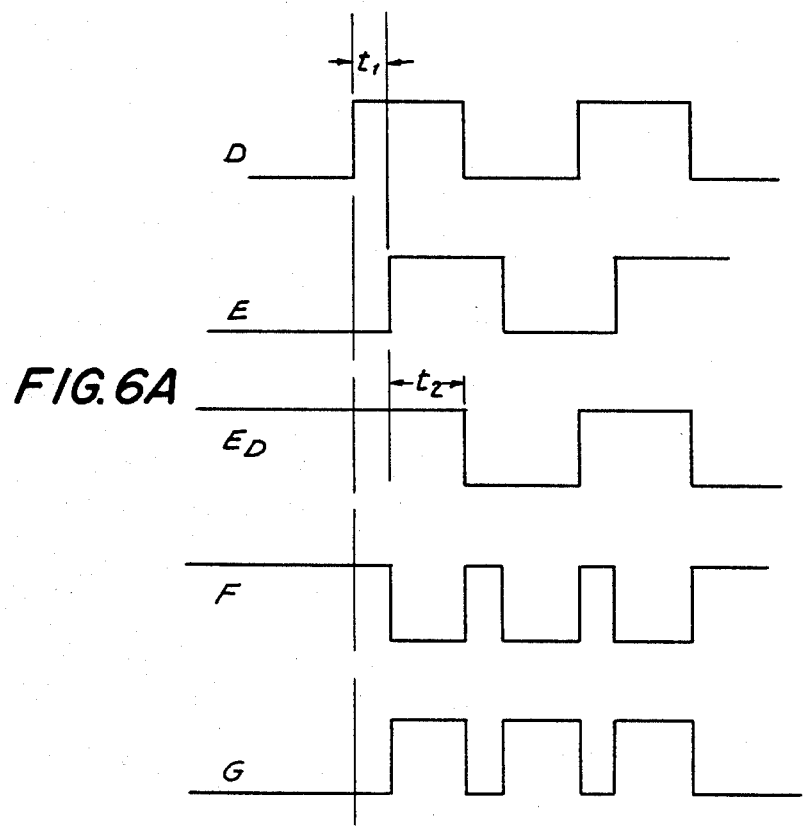
FIG. 6A illustrates a set of timing diagrams for the circuit of FIG. 5.

FIG. 6A illustrates typical waveforms for the circuit of FIG. 5. Waveform D is taken as an output of oscillator circuit 20', although if desired, the logical opposite is available at the $\overline{Q}$ output of flip flop 22'. Delay circuit 24' delays waveform D to produce waveform E, a delayed input signal, at the output of inverter 30D. Edge detector 10" processes waveform E to produce waveform $E_D$ at the output of delay/inverter circuit 14" and to produce waveform F, an output logic signal, at the output of EXCLUSIVE OR gate 12. Inverter 26 inverts waveform F to produce at its output waveform G, which is used to clock flip flop 22' as discussed above.

Figure 6B:
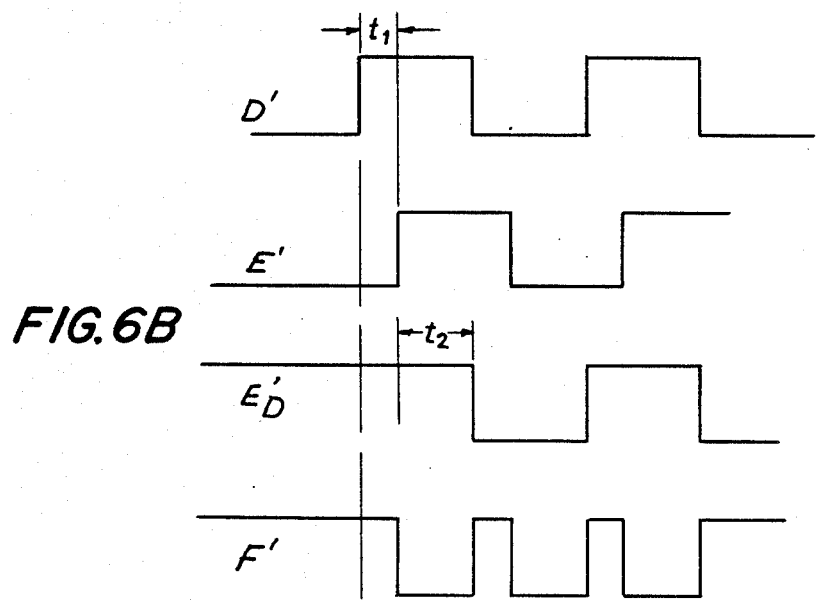
FIG. 6B illustrates a set of timing diagrams for a circuit corresponding to that of FIG. 5, using a flip flop triggered on a leading edge of a clock signal.

It will be recognized that other implementations of an oscillator circuit according to the invention are possible by modifying circuit 20'. For example, inverter 26 may be eliminated if the J-K flip flop 22' is a positive edge triggered J-K flip flop. The output of EXCLUSIVE OR gate 12 is then connected directly to the clock input of the flip flop. The waveforms for a circuit according to FIG. 4 or FIG. 5 modified in this manner at points corresponding to those where waveforms D, E, $E_D$ and F are obtained, are illustrated in FIG. 6B, as waveforms D', E', $E_D$' and F', respectively.

The frequency of output waveform D (or D') is dependent on the total delay produced by both delay/inverter circuit 14" and delay circuit 24'. In particular, the length of time T required for a half cycle of output waveform D is equal to the sum of the delays produced by delay circuit 24' (as represented by the time interval $t_1$, separating transitions in waveform D and E), the time interval $t_2$ produced by delay/inverter circuit 14" and any incidental delays in EXCLUSIVE OR gate 12, inverter 26, flip flop 22', AND gate 28 and by propagation along conductors connecting these elements. However, such incidental delays may be minimized so as to be fairly small in comparison to the delays provided by delay/inverter circuit 14" and delay circuit 24'.

Thus, circuits 20 and 20' may be used to encode more than one variable on to output waveform D. The period of waveform D varies in accordance with the sum of the delays introduced by delay/inverter circuit 14" and delay circuit 24'. As noted above with respect to delay circuit 14, the amount of delay introduced by delay circuit 24' may be varied in accordance with the value of an electrical parameter. The value of this electrical parameter may change in accordance with a physical variable such as temperature, pressure, or humidity. For example, one or both of circuits 14" and 24' may be constructed in the same manner as circuit 14 of FIG. 1 to include at least one transducer and to provide a delay inversely proportional to the velocity of sound in a material. Thus the circuit of FIG. 5 can provide an output signal having a frequency which varies in accordance with the values of two different variables. Further, the logic input applied to control line 30 determines whether or not oscillator circuit 20' will oscillate.

Circuit 20' thus finds applications as a basic oscillator, if the delays in the circuit are fixed, a digital word generator if a predetermined sequence of control signals is applied to control line 30 or can be used in any one of many applications to frequency encode the values of two different variables.

The circuit 10' of FIG. 2 may be constructed using an SN 7486 EXCLUSIVE OR gate and five of the six inverters in an SN 7404 hex inverter chip. Circuit 20' may be constructed by using, in addition to the above components, further SN 7404 hex inverters, as may be required, an SN 74108 J-K flip flop, and any one of many standard AND gates.

Although shown and described in what are believed to be the most practical and preferred embodiments, it is apparent that departures from the specific designs described and shown will suggest themselves to those skilled in the art and may be made without departing from the spirit and scope of the invention. I, therefore, do not wish to restrict myself to the particular construction described and illustrated, but desire to avail myself of all modifications that may fall within the scope of the appended claims.

I claim:

1. An electronic circuit comprising:

delay and inverting means for logically inverting and delaying an input signal to supply a delayed and inverted pulse;

gate means having a first input for receiving said input signal and a second input for receiving said delayed and inverted signal, said gate means providing a logic output signal whenever said input signal and said delayed a inverted signal are at different logic levels;

delay means for delaying said input signal supplied to the input of the delay and inverting means and to the first input of the gate means; and an additional gate means, said additional gate means having an input for receiving said logic output signal and an output connected to an input of the delay means, said additional gate means being configured so that a logic gate of pulses provided at an output thereof changes upon selected changes in state of said logic output signal.

2. The circuit of claim 1, wherein said delay and inverting means is configured to delay said input signal for a period of time shorter than a width of said input signal.

3. The circuit of claim 1, wherein said delay and inverting means comprises:

at least one delay means for delaying said input signal; and a logic inverter for inverting said input signal;

said delay means and said logic inverter being separate components of said circuit.

4. The circuit of claim 1, wherein said delay and inverting means provides a variable delay in accordance with a value of an electrical parameter, whereby the duration of said logic output signal is varied.

5. The circuit of claim 1, wherein said delay and inverting means includes a transducer means, said transducer means changing delay introduced by said delay and inverting means in accordance with a physical variable.

6. The circuit of claim 1, wherein said delay and inverting means includes an odd number of logic inverter gates, the input of a first of said gates receiving said input signal, the outputs of said first logic inverter gate and successive ones of said logic inverter gates being connected to an input of the successive logic inverter gate, and an output of a last of said logic inverter gates being connected to said second input of said gate means.

7. The circuit of claim 6, wherein said odd number is five.

8. The circuit of claim 1, wherein said gate means is an EXCLUSIVE OR gate.

9. The circuit of claim 1, wherein said additional gate means is a J-K flip-flop, with J and K inputs thereof held at logic high, the flip flop having a clock input for receiving said logic output signal.

10. The circuit of claim 1, wherein said delay means is configured to delay said input signal for a period of time shorter than a width of said input signal.

11. The circuit of claim 1, wherein said delay means provides a variable delay in accordance with a value of an electrical parameter, whereby the duration of said logic output signal is varied.

12. The circuit of claim 1, wherein said delay means includes a transducer means, said transducer means changing delay introduced by said delay means in accordance with a physical variable.

13. The circuit of claim 1, wherein said delay means includes an even number of logic inverter gates, the input of a first of said gates receiving said input signal, the outputs of said first logic inverter gate and successive ones of said logic inverter gates being connected to the input of the successive logic inverter gate, and the output of a last of said logic inverter gates being connected to the input of the delay and inverting means and to the first input of said gate means.

14. The circuit of claim 1, further comprising a control gate means, said control gate means having a first input for receiving the pulses provided by said additional gate means, a second input for receiving a control signal and an output connected to the input of said delay means for supplying a controlled input signal to the input of said delay means, said control gate being configured so that a logic state of said control signal controls whether said controlled input pulse is supplied.

15. The circuit of claim 14, wherein said control gate means is an AND gate.

16. The circuit of claim 14, wherein said delay means is configured to delay said input signal for a period of time shorter than a width of said input signal.

17. An electronic circuit comprising:
delay and inverting means for logically inverting and delaying an input signal to supply a delayed and inverted pulse;
gate means having a first input for receiving said input signal and a second input for receiving said delayed and inverted signal, said gate means providing a logic output signal whenever said input signal and said delayed and inverted signal are at different logic levels;
a delay means for delaying said input signal; and
an additional gate means for receiving said logic output signal, said additional gate means being responsive to selected transitions in said logic output signal, said additional gate means having an output for providing said input signal to said delay means, said additional gate means providing, at said output, output pulses of proper logic sense to cause said circuit to oscillate.

18. The circuit of claim 17 wherein said additional gate means is a J-K flip flop configured so that said J-K flip flop toggles on the trailing edge of said logic output signal, and said delay means is connected to the Q output of said J-K flip flop, said circuit further comprising a logic inverter means, said logic inverter means having an input for receiving said logic output signal and an output connected to a clock input of said J-K flip flop.

19. The circuit of claim 17, wherein said additional gate means is a J-K flip flop configured so that said J-K flip flop toggles on the trailing edge of said logic output signal, and said delay means is connected to the Q output of said J-K flip flop.

20. An electronic circuit comprising:
an edge detector for producing a logic output pulse upon a transition in logic level of an input signal supplied thereto;
a delay means for delaying said input signal supplied to said edge detector; and
a gate means, said gate means having an input for receiving said logic output signal and an output connected to an input of said delay means, said gate means being configured so that a logic state of pulses provided at an output thereof changes upon selected changes in state of said logic output signal.

21. The circuit of claim 20, wherein said logic state of pulses provided at said output of said gate mean is of a proper logic sense to cause said circuit to oscillate.

22. The circuit of claim 20, wherein said delay means is configured to delay said input signal for a period of time shorter than a width of said input signal.

23. The circuit of claim 20, wherein said delay means provides a variable delay in accordance with a value of an electrical parameter, whereby the duration of said logic output signal is varied.

24. The circuit of claim 20, wherein said delay means includes a transducer means, said transducer means changing delay introduced by said delay means in accordance with a physical variable.

25. The circuit of claim 20, further comprising a control gate means, said control gate means having a first input for receiving the pulses provided by said gate means, a second input for receiving a control signal and an output connected to the input of said delay means for supplying a controlled input signal to the input of said delay means, said control gate being configured so that a logic state of said control signal controls whether said controlled input pulse is supplied.

26. The circuit of claim 20, wherein said gate means is a J-K flip flop configured so that said J-K flip flop toggles on the trailing edge of said logic output signal, and said delay means is connected to the Q output of said J-K flip flop, said circuit further comprising a logic inverter means, said logic inverter means having an input for receiving said logic output signal and an output connected to a clock input of said J-K flip flop.

27. The circuit of claim 20, wherein said gate means is a J-K flip flop configured so that said J-K flip flop toggles on the trailing edge of said logic output signal, and said delay means is connected to the Q output of said J-K flip flop.

* * * * *